United States Patent
Zhao et al.

(10) Patent No.: US 9,041,171 B2
(45) Date of Patent: May 26, 2015

(54) PROGRAMMABLE INTERPOSER WITH CONDUCTIVE PARTICLES

(75) Inventors: Sam Ziqun Zhao, Irvine, CA (US); Kevin Kunzhong Hu, Irvine, CA (US); Sampath K. V. Karikalan, Irvine, CA (US); Rezaur Rahman Khan, Rancho Santa Margarita, CA (US); Pieter Vorenkamp, Laguna Niguel, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 179 days.

(21) Appl. No.: 13/340,430

(22) Filed: Dec. 29, 2011

(65) Prior Publication Data

US 2013/0168841 A1    Jul. 4, 2013

(51) Int. Cl.
| | |
|---|---|
| *H01L 21/326* | (2006.01) |
| *H01L 23/495* | (2006.01) |
| *H05K 1/11* | (2006.01) |
| *B82Y 99/00* | (2011.01) |
| *H01L 23/498* | (2006.01) |
| *H05K 1/02* | (2006.01) |
| *H01L 21/48* | (2006.01) |
| *H05K 3/40* | (2006.01) |

(52) U.S. Cl.
CPC . *H01L 23/49827* (2013.01); *H01L 2224/16225* (2013.01); *H05K 1/029* (2013.01); *H05K 3/4038* (2013.01); *H05K 2201/0248* (2013.01); *H05K 2201/026* (2013.01); *H05K 2201/0323* (2013.01); *H05K 2201/10378* (2013.01); *H05K 2203/104* (2013.01); *H05K 2203/105* (2013.01); *H01L 23/49822* (2013.01); *H01L 21/485* (2013.01); *H01L 21/486* (2013.01)

(58) Field of Classification Search
CPC ...... H01L 23/495; H01L 21/326; H05K 1/11; B82Y 99/00
USPC ........... 257/676, E23.037; 438/468; 174/261; 977/742
See application file for complete search history.

(56) References Cited

U.S. PATENT DOCUMENTS

| | | | | |
|---|---|---|---|---|
| 4,548,862 A | * | 10/1985 | Hartman | 428/323 |
| 4,581,679 A | * | 4/1986 | Smolley | 361/742 |
| 2003/0102154 A1 | * | 6/2003 | Haba | 174/257 |
| 2005/0104178 A1 | * | 5/2005 | McFarland et al. | 257/678 |
| 2005/0142933 A1 | * | 6/2005 | Beer et al. | 439/540.1 |

* cited by examiner

*Primary Examiner* — Peniel M Gumedzoe
(74) *Attorney, Agent, or Firm* — McDermott Will & Emery LLP

(57) ABSTRACT

An exemplary implementation of the present disclosure includes a programmable interposer having top and bottom interface electrodes and conductive particles interspersed within the programmable interposer. The conductive particles are capable of forming an aligned configuration between the top and bottom interface electrodes in response to application of an energy field to the programmable interposer so as to electrically connect the top and bottom interface electrodes. The conductive particles can have a conductive outer surface. Also, the conductive particles can be spherical. The conductive particles can be within a bulk material in an interface layer in the programmable interposer, and the bulk material can be cured to secure programmed paths between the top and bottom interface electrodes.

21 Claims, 6 Drawing Sheets

PROGRAMMABLE INTERPOSER WITH CONDUCTIVE PARTICLES

BACKGROUND

Interposers can have a variety of functions and forms, but generally serve to facilitate connection between different electrical components. As one example, an interposer can be employed to connect inputs/outputs (I/Os) of an electrical component, such as a semiconductor die, to another electrical component. In some cases, the interposer spreads or otherwise reroutes I/Os of an electrical component to achieve a wider pitch, or to otherwise accommodate connection to the I/Os. For example, an interposer can be utilized to allow for connection to I/Os by way of a ball grid array (BGA) or other means.

As interposers are employed in a variety of applications, they are typically designed and fabricated individually to adequately take advantage of or to enable specific features in a particular application. For example, in some cases the interposer must connect to a large number of I/Os, which have a particular arrangement on an electrical component. Also, in some cases, different applications may utilize the same electrical component, but require different interposers due to differing I/O requirements.

SUMMARY

The present disclosure is directed to programmable interposer with conductive particles, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
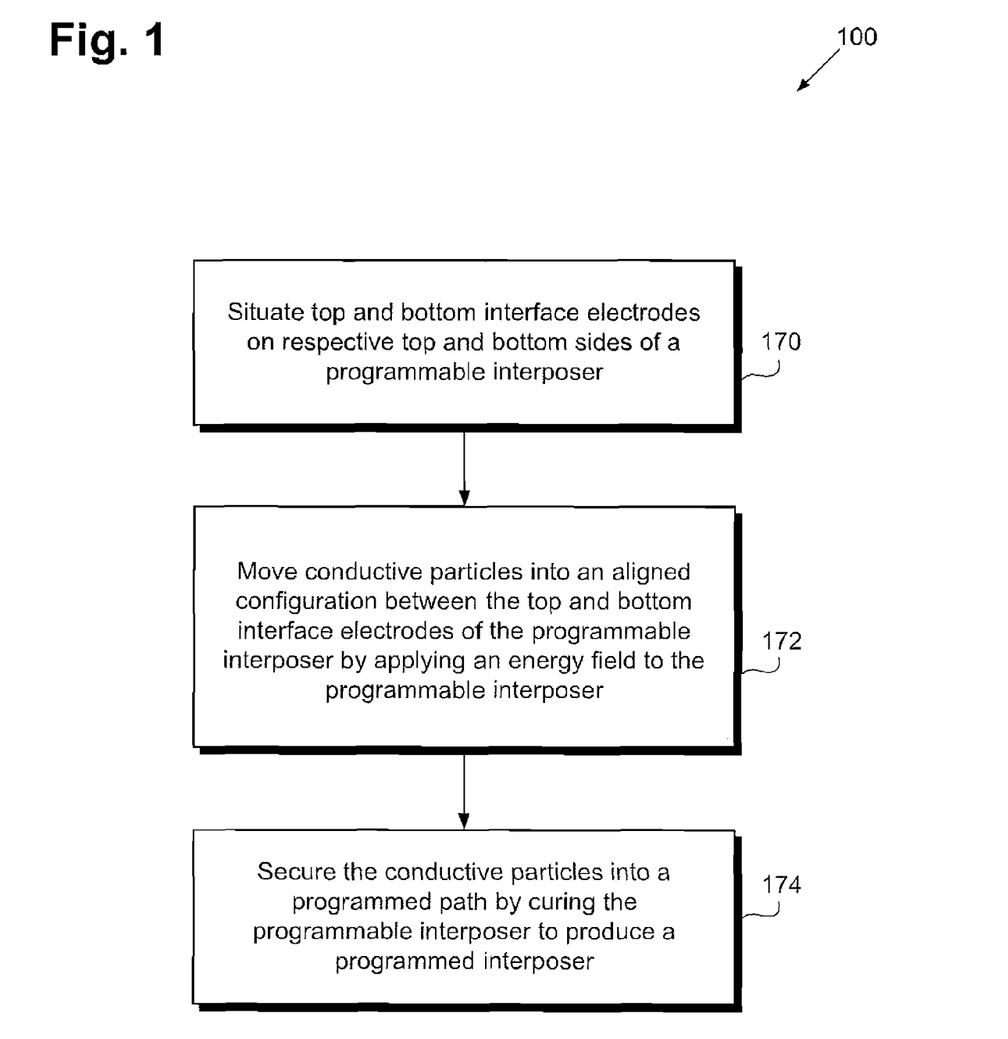
FIG. 1 presents an exemplary flowchart illustrating a method for fabricating a programmed interposer, according to an implementation of the present disclosure.

FIG. 1 presents exemplary flowchart 100 illustrating a method for fabricating a programmed interposer. The approach and technique indicated by flowchart 100 are sufficient to describe at least one implementation of the present disclosure, however, other implementations of the disclosure may utilize approaches and techniques different from those shown in flowchart 100. Furthermore, while flowchart 100 is described with respect to FIGS. 2A, 2B, & 2C the disclosed inventive concepts are not intended to be limited by specific features shown in FIGS. 2A, 2B, & 2C.

Figure 2A:
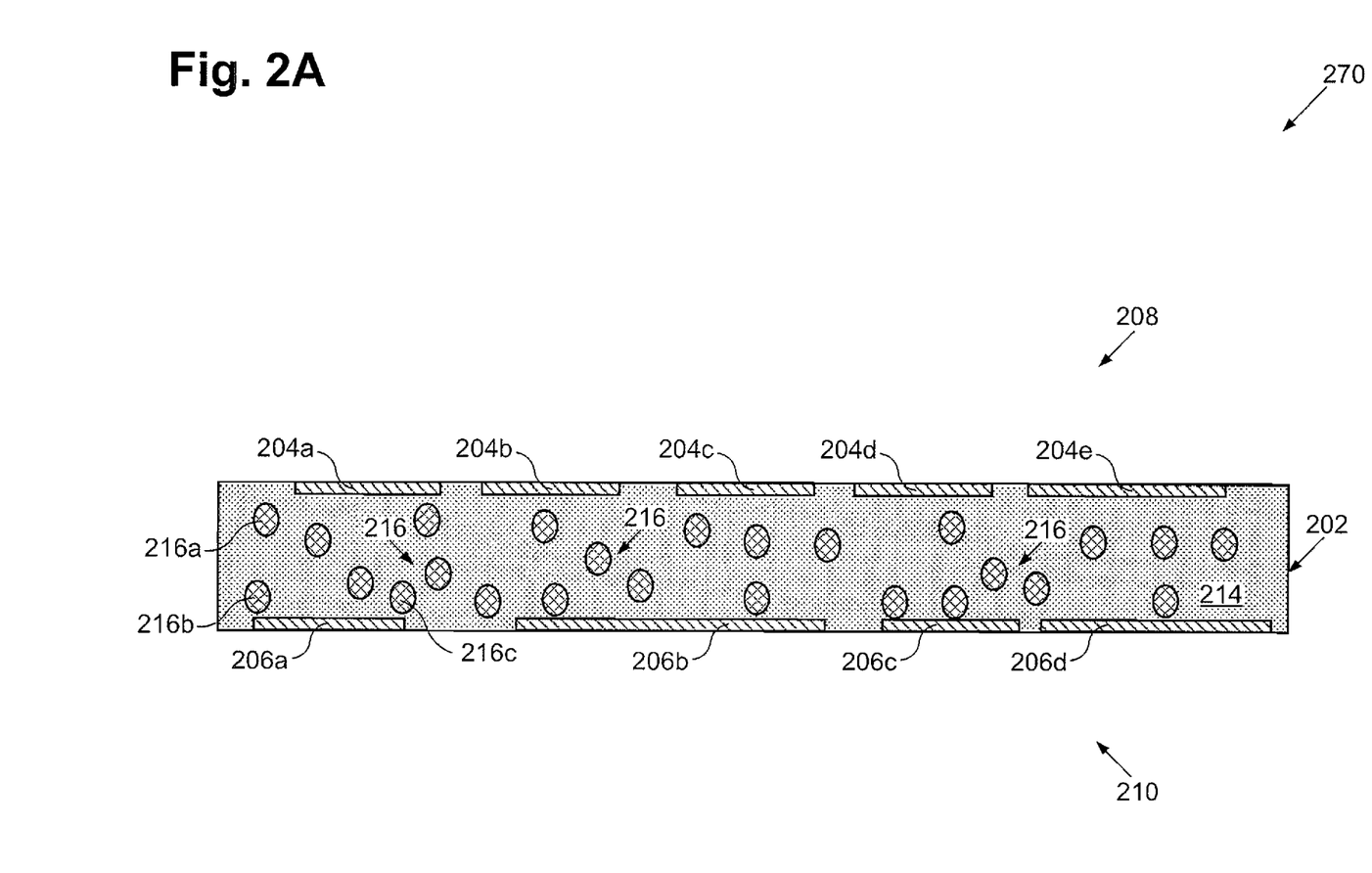
FIG. 2A presents an exemplary cross-sectional view of a programmable interposer, according to an implementation of the present disclosure.

Referring to flowchart 100 of FIG. 1 and FIG. 2A, flowchart 100 includes situating top and bottom interface electrodes on respective top and bottom sides of a programmable interposer (action 170 in flowchart 100). FIG. 2A shows a cross-section of programmable interposer 270 after action 170, in accordance with implementations of the present disclosure.

Programmable interposer 270 includes interface layer 202, top interface electrodes 204a, 204b, 204c, 204d, and 204e (also referred to collectively as "top interface electrodes 204"), and bottom interface electrodes 206a, 206b, 206c, and 206d (also referred to collectively as "bottom interface electrodes 206"). Top interface electrodes 204 are on top side 208 of programmable interposer 270 and bottom interface electrodes 206 are on bottom side 210 of programmable interposer 270.

As shown in FIG. 2A, in the present implementation, top interface electrodes 204 are embedded in interface layer 202 on top side 208 of programmable interposer 270 and bottom interface electrodes 206 are embedded in interface layer 202 on bottom side 210 of programmable interposer 270. In other implementations, at least one of top and bottom interface electrodes 204 and 206 are not embedded in interface layer 202. Furthermore, in the present implementation, top and bottom interface electrodes 204 and 206 are conductive pads, such as copper pads. However, top and bottom interface electrodes 204 and 206 can have different forms. For example, in some implementations, top and/or bottom interface electrodes 204 and 206 are conductive vias in a substrate. As another example, in some implementations, top and/or bottom interface electrodes 204 and 206 are solder balls. In yet other implementations, top and/or bottom interface electrodes 204 and 206 are conductive probes.

Interface layer 202 has bulk material 214 and conductive particles 216, of which conductive particles 216a, 216b, and 216c are individually labeled in FIG. 2A. Selected portions of interface layer 202 can also include, for example, a conductive paste or a conductive epoxy.

In the present implementation, bulk material 214 is a dielectric, and more particularly a dielectric film, although bulk material 214 can have different forms. Thus, conductive particles 216 are providing means for conductivity in interface layer 202. In one implementation, bulk material 214 is an epoxy. In various implementations, bulk material 214 is non-rigid or semi-rigid, and in some cases is capable of being cured (i.e. hardened).

Conductive particles 216 are interspersed within bulk material 214 of programmable interposer 270. Conductive particles 216 can take many forms. As examples, conductive particles 216 can be any combination of carbon nanotubes (CNT), nano wires, or other conductive particles. In the present implementation, conductive particles 216 are spherical. Furthermore, conductive particles 216 have at least one conductive outer surface. In some implementations, conductive particles 216 include a metal or a metal alloy. For example, conductive particles 216 can be silver particles.

In action 170, top and bottom interface electrodes 204 and 206 are situated on respective top and bottom sides 208 and 210 of programmable interposer 270. Action 170 can be accomplished in various manners. In one specific implementation, top interface electrodes 204 are arranged on a top laminate tape (not shown) and bottom interface electrodes 206 are arranged on a bottom laminate tape (not shown). Interface layer 202 is applied over either top interface electrodes 204 or bottom interface electrodes 206 and one of the top or bottom laminate tapes is flipped over so that interface layer 202 is sandwiched between the top and bottom laminate tapes. The top and bottom laminate tapes can subsequently be removed at an appropriate time (such as after action 174).

Figure 2B:
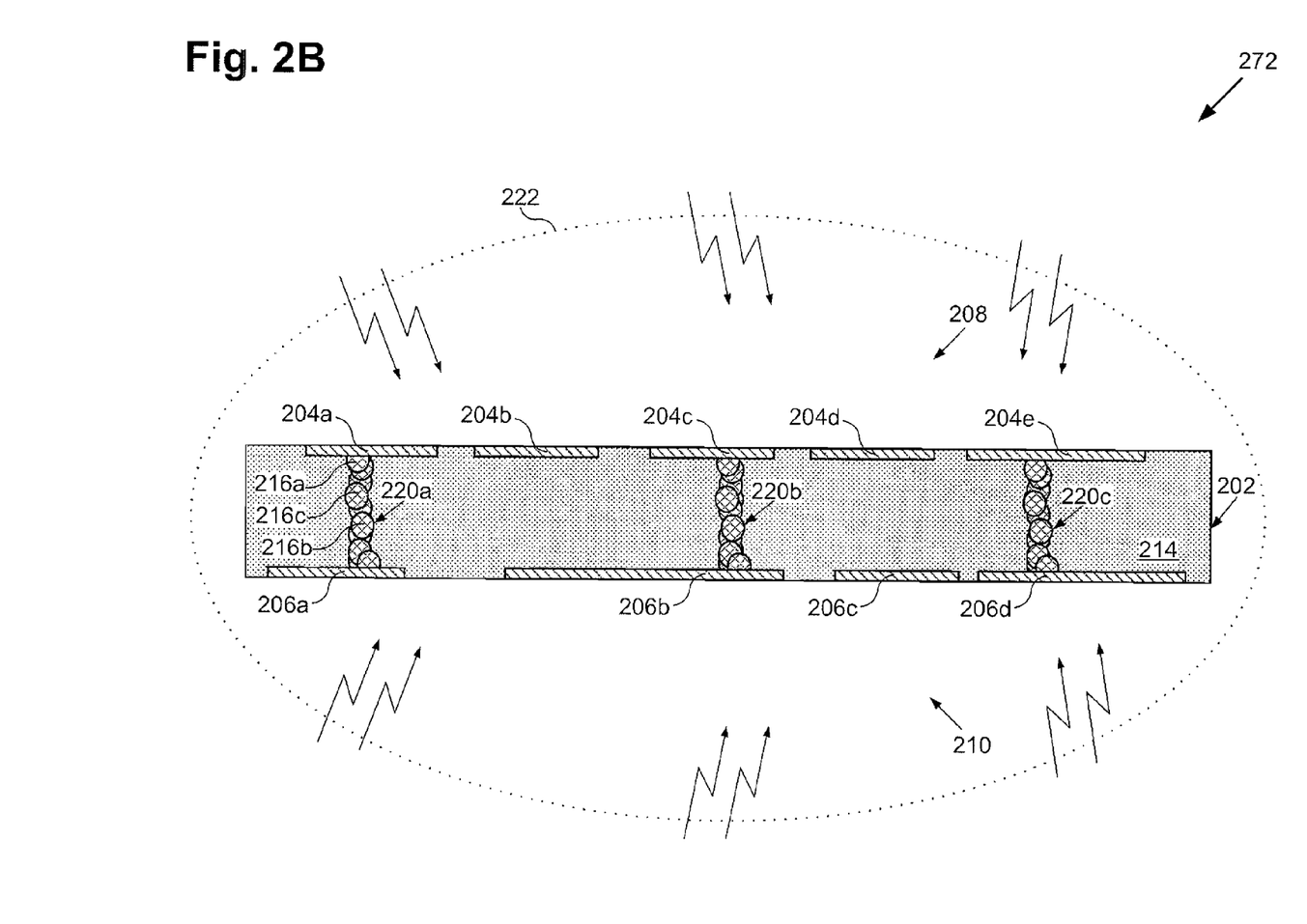
FIG. 2B presents an exemplary cross-sectional view of a programmable interposer, according to an implementation of the present disclosure.

Referring now to flowchart 100 of FIG. 1 and FIG. 2B, flowchart 100 includes moving conductive particles into an aligned configuration between the top and bottom interface electrodes of the programmable interposer by applying an energy field to the programmable interposer (action 172 in flowchart 100). FIG. 2B shows a cross-section of programmable interposer 272, which corresponds to programmable interposer 270 after action 172, in accordance with implementations of the present disclosure.

Programmable interposer 272 includes aligned configurations 220a, 220b, and 220c (also referred to collectively as "aligned configurations 220"). Aligned configurations 220 are between respective top and bottom interface electrodes 204 and 206 so as to electrically connect top and bottom interface electrodes 204 and 206. For example, aligned configuration 220a is between top and bottom interface electrodes 204a and 206a so as to electrically connect top and bottom interface electrodes 204a and 206a.

In the present implementation, conductive particles 216 are capable of forming aligned configurations 220 between top and bottom interface electrodes 204 and 206 in response to application of energy field 222 to programmable interposer 270 so as to electrically connect top and bottom interface electrodes 204 and 206. As shown in FIG. 2B, aligned configurations 220 each include conductive particles 216. For example, aligned configuration 220a includes conductive particles 216a, 216b, and 216c. Thus, aligned configurations 220 can be utilized to electrically connect different ones of top and bottom interface electrodes 204 and 206. It is noted that interface layer 202 can have some conductive particles 216 that are not part of aligned configurations 220 (not shown).

In action 172, conductive particles 216 are moved into aligned configurations 220 between top and bottom interface electrodes 204 and 206 of programmable interposer 270 of FIG. 2A by applying energy field 222 to programmable interposer 270. In the present implementation, energy field 222 is applied to top side 208 and bottom side 210 of programmable interposer 270. Energy field 222 can include various types of energies that are suitable for moving conductive particles 216 into aligned configurations 220. In exemplary implementations, energy field 222 includes any combination of an electric field, a magnetic field, an electromagnetic field, a heat field, a current field, an acoustic field, and a radiation field. In some implementations, because top and bottom interface electrodes 204 and 206 are conductive, energy field 222 can cause conductive particles 216 to be attracted to any of top and bottom interface electrodes 204 and 206. Also, in some implementations, energy field 222 is applied to top and bottom interface electrodes 204 and 206, for example, by making physical and/or proximity based contact to top and bottom interface electrodes 204 and 206.

Furthermore, in various implementations, utilizing energy field 222, conductive particles 216 are selectively moved into aligned configurations 220 between top and bottom interface electrodes 204 and 206. Thus, for example, aligned configurations 220 may not be between some of top and bottom interface electrodes 204 and 206 as shown in FIG. 2B. Furthermore, aligned configurations 220 can be between different ones of top and bottom interface electrodes 204 and 206 than what is shown in FIG. 2B. For example, energy field 222 can be varied to control conductive particles 216 such that aligned configuration 220a may instead be between top electrode 204b and bottom electrode 206a. Similarly, aligned configurations 220b and 220c can be between different top and bottom electrodes 204 and 206 than what is shown.

Also, in some implementations, energy field 222 can be varied to form additional aligned configurations 220. Thus, as described above, aligned configurations 220 can be controllably varied in programmable interposer 272 so as to select amongst different electrical connections between top and bottom interface electrodes 204 and 206. In this manner, programmable interposer 270 of FIG. 2A can be programmed to form various different electrical connections.

Figure 2C:
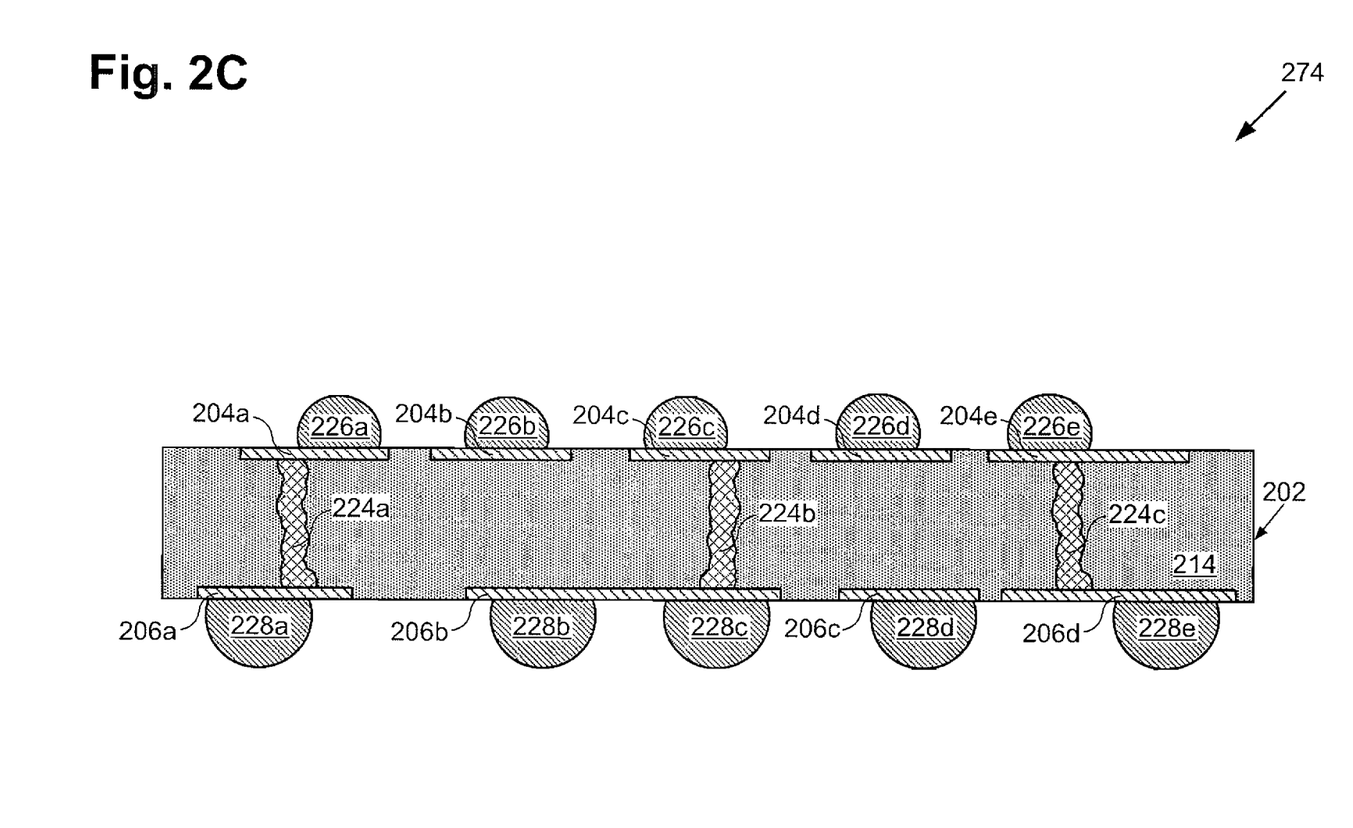
FIG. 2C presents an exemplary cross-sectional view of a programmed interposer, according to an implementation of the present disclosure.

Moving to flowchart 100 of FIG. 1 and FIG. 2C, flowchart 100 includes securing the conductive particles into a programmed path by curing the programmable interposer to produce a programmed interposer (action 174 in flowchart 100). FIG. 2C shows a cross-section of programmed interposer 274, which corresponds to programmable interposer 272 after action 174, in accordance with implementations of the present disclosure.

Programmed interposer 274 includes programmed paths 224a, 224b, and 224c (also referred to collectively as "programmed paths 224"), top solder balls 226a, 226b, 226c, 226d, and 226e (also referred to collectively as "top solder balls 226"), and bottom solder balls 228a, 228b, 228c, 228d, and 228e (also referred to collectively as "bottom solder balls 228"). Programmed paths 224 are distinguishable from corresponding aligned configurations 220 at least by virtue of being secured in programmed interposer 274. Programmed paths 224 are formed from conductive particles 216 and are electrically connecting top and bottom interface electrodes 204 and 206. For example, programmed path 224a is electrically connecting top and bottom interface electrodes 204a and 206a. Thus, top and bottom interface pads 204 and 206 and programmed paths 224 can be utilized to facilitate connection between electrical components (e.g., as demonstrated by FIG. 4).

In the present implementation, top solder balls 226 are formed on top interface electrodes 204 and bottom solder balls 226 are formed on bottom interface electrodes 206. In some implementations, top solder balls 226 and bottom solder balls 226 are formed after curing programmable interposer 272. In other implementations, top solder balls 226 and bottom solder balls 226 are formed prior to curing programmable interposer 272. As one example, top solder balls 226 can be formed on top interface electrodes 204 and bottom solder balls 226 can be formed on bottom interface electrodes 206 prior to action 170.

Top solder balls 226 and bottom solder balls 228 can be utilized for connection to top and bottom interface electrodes 204 and 206. Top solder balls 226 can be, for example, fine pitched micro bumps and bottom solder balls 226 can be larger in size and pitch. Thus, in some implementations, programmed interposer 274 is a ball grid array (BGA) interposer and can achieve a wider pitch to accommodate connection to inputs/outputs (I/Os) that are electrically connected to programmed paths 224.

It will be appreciated that inventive concepts described herein are not limited to BGA interposers, but are applicable to a wide range of interposer deigns. Thus, for example, top solder balls 226 and bottom solder balls 228 are exemplary and are not included in each implementation of the present disclosure. For example, various other means can be utilized for connection to top and bottom interface electrodes 204 and 206. As one example, in some implementations, top and/or bottom interface electrodes 204 and 206 are solderable metal contacts.

In action 174, conductive particles 216 of aligned configurations 220 are secured into programmed paths 224 by curing programmable interposer 272 to form programmed interposer 274. In some implementations, other securing means can be utilized instead of or in addition to curing. However, in the present implementation, programmable interposer 272 is capable of being cured and securing includes curing programmable interposer 272. For example, bulk material 214 can be cured to thereby secure conductive particles 216 of aligned configurations 220 into programmed paths 224.

In one implementation, curing includes applying heat to programmable interposer 272. In some implementations, the heat also melts together conductive particles 216 into programmed paths 224. Also, in some implementations, securing does not include curing bulk material 214. For example, heat can be applied to conductive particles 216 of aligned configurations 220 to secure conductive particles 216 into programmed paths 224 by, for example, melting together conductive particles 216.

Thus, as described above, in various implementations, conductive particles 216 are selectively moved into aligned configurations 220 between top and bottom interface electrodes 204 and 206, and are subsequently secured into programmed paths 224. In this manner, programmable interposer 270 of FIG. 2A can be programmed to form various different electrical connections. Thus, programmable interposer 270 of FIG. 2A can be utilized to achieve different programmed paths 224 (i.e. different programmed interposers 274) depending on application requirements without requiring highly differentiated design and fabrication processes. Among other advantages, some implementations of the present disclosure can thereby enable use of an interposer in applications where such use would otherwise be cost and/or time prohibitive. Such cases include applications that would otherwise not be of sufficient volume to offset costs of the interposer.

Figure 3:
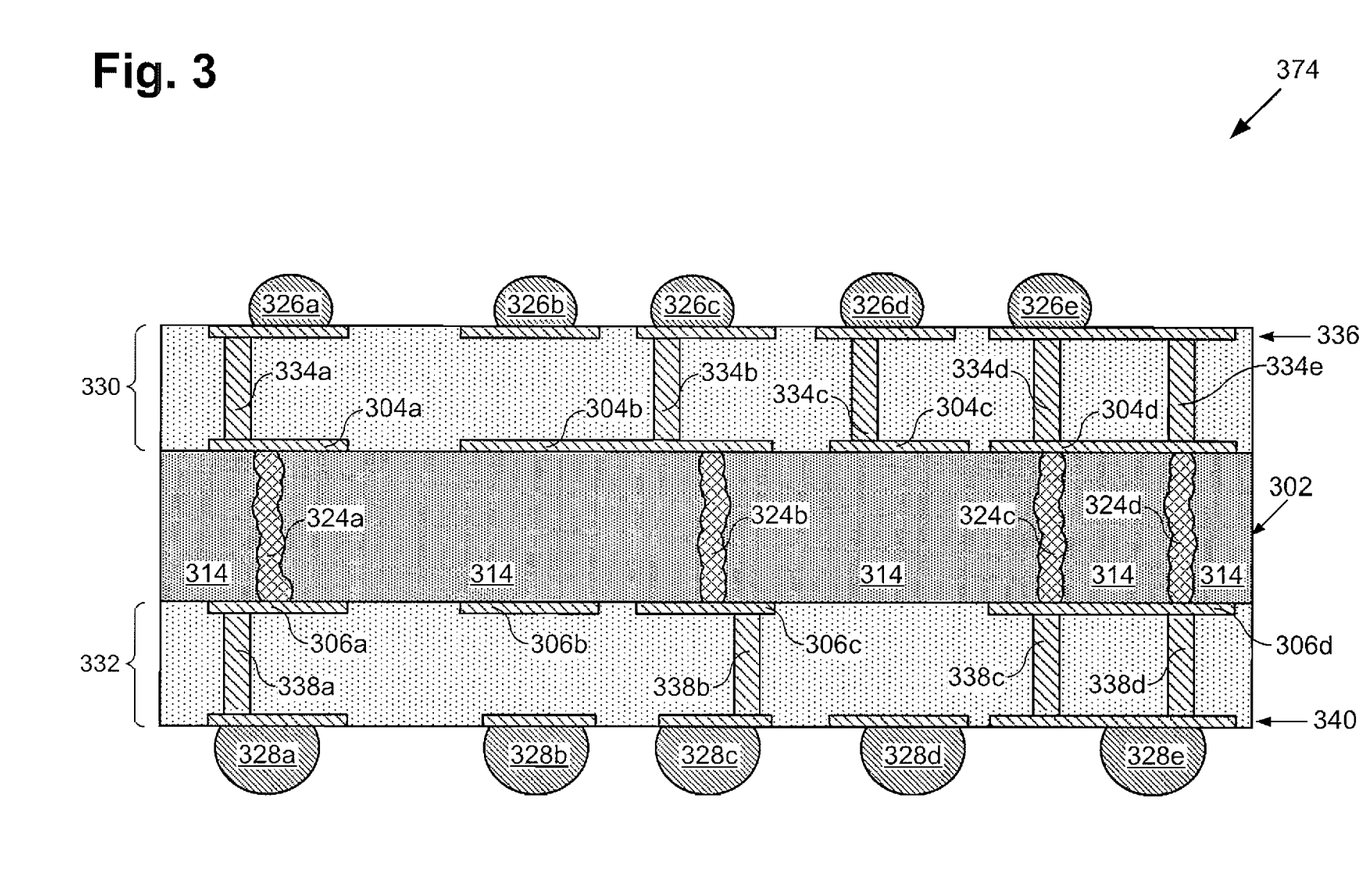
FIG. 3 presents an exemplary cross-sectional view of a programmed interposer, according to an implementation of the present disclosure.

Referring now to FIG. 3, FIG. 3 presents an exemplary cross-sectional view of programmed interposer 374, according to an implementation of the present disclosure. Programmed interposer 374 includes interface layer 302, top interface electrodes 304a, 304b, 304c, 304d, and 304e (also referred to collectively as "top interface electrodes 304"), bottom interface electrodes 306a, 306b, 306c, and 306d (also referred to collectively as "bottom interface electrodes 306"), bulk material 314, programmed paths 324a, 324b, 324c, and 324d (also referred to collectively as "programmed paths 324"), top solder balls 326a, 326b, 326c, 326d, and 326e (also referred to collectively as "top solder balls 326"), and bottom solder balls 328a, 328b, 328c, 328d, and 328e (also referred to collectively as "bottom solder balls 328") corresponding respectively to interface layer 202, top interface electrodes 204, bottom interface electrodes 206, bulk material 214, programmed paths 224, top solder balls 226, and bottom solder balls 228 in FIG. 2C.

Programmed interposer 374 also includes top substrate 330 and bottom substrate 332. In some implementations programmed interposer 374 includes only one of top and bottom substrates 330 and 332. Also, in some implementations, programmed interposer 374 includes more than two substrates. In the present implementations, top and bottom substrates 330 and 332 are semiconductor substrates and more particularly silicon substrates. However, at least one of top and bottom substrates 330 and 332 are other types of substrates, such as printed circuit board (PCB) substrates, in various implementations.

Interface layer 302 is on top substrate 330 and bottom substrate 332. As shown in FIG. 3, in the present implementation, top substrate 330 includes through silicon vias (TSVs) 334a, 334b, 334c, 334d, and 334e (also referred to collectively as "TSVs 334") and top redistribution layer 336. TSVs 334 are connecting top interface electrodes 304 to top redistribution layer 336. Also shown in FIG. 3, in the present implementation, bottom substrate 332 includes TSVs 338a, 338b, 338c, and 338d (also referred to collectively as "TSVs 338") and bottom redistribution layer 340. TSVs 338 are connecting bottom interface electrodes 306 to bottom redistribution layer 340.

In some implementations, at least one substrate (e.g. top substrate 330 or bottom substrate 332) is provided prior to the moving of action 172. For example, interface layer 302 can be situated on top substrate 330 and bottom substrate 332 prior to action 172. Also, in one implementation, action 170 includes situating interface layer 302 on top substrate 330 and bottom substrate. For example, in one implementation, top interface electrodes 304 are formed on top substrate 330 and bottom interface electrodes 306 are formed on bottom substrate 332 prior to action 170. In some implementations, after situating interface layer 302 on top substrate 330 and bottom substrate 332, actions 172 and 174 are performed to provide programmed interposer 374. However, in other implementations, interface layer 302 is situated on top substrate 330 and bottom substrate 332 after action 172 or action 174.

By utilizing top and/or bottom substrates 330 and 332, programmed interposer 374 can have more robust routing than programmed interposer 274, while still providing the capability to be programmed to form various different electrical connections. For example, as described above, the method illustrated by flowchart 100 can similarly be utilized for fabricating programmed interposer 374.

Figure 4:
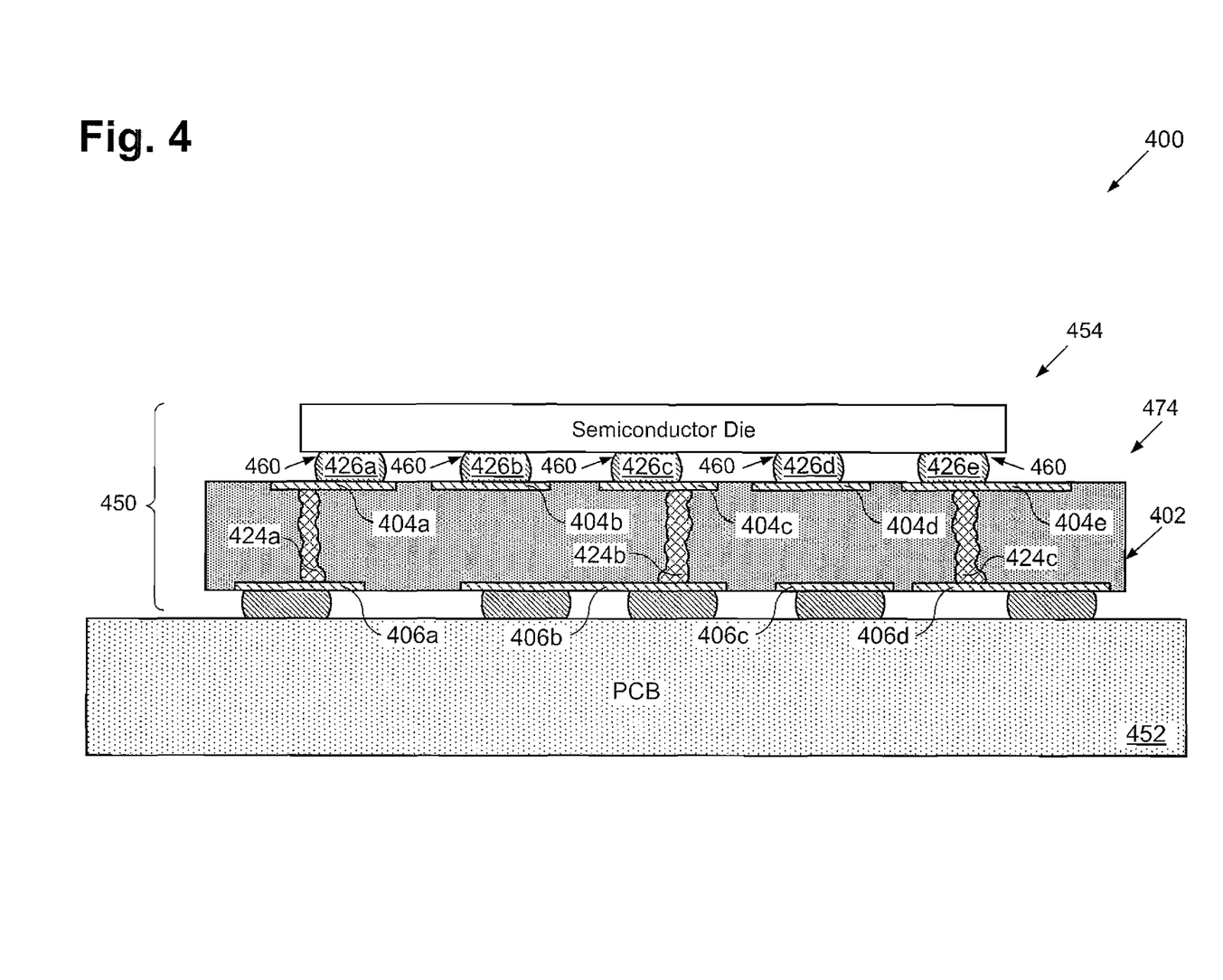
FIG. 4 presents an exemplary cross-sectional view of a structure, including a semiconductor package, according to an implementation of the present disclosure.

Referring to FIG. 4, FIG. 4 presents an exemplary cross-sectional view of a structure, including a semiconductor package, according to an implementation of the present disclosure. As shown in FIG. 4, structure 400 includes semiconductor package 450 on PCB 452. Semiconductor 450 includes electrical component 454 and programmed interposer 474.

In the present implementation, electrical component 454 is a semiconductor die and is also referred to herein as semiconductor die 454. Semiconductor die 454 has I/Os 460 and programmed interposer 474 corresponds to programmed interposer 274 in FIG. 2C. It is noted that in other implementations, programmed interposer 474 corresponds to programmed interposer 374 in FIG. 3. Thus, programmed interposer 474 can include interface layer 402 and at least one substrate, such as top substrate 330 and bottom substrate 332 of FIG. 3 (not shown in FIG. 4).

Semiconductor die 454 is electrically connected to top interface electrodes 404a, 404b, 404c, 404d, and 404e (top interface electrodes 404) and bottom interface electrodes 406a, 406b, 406c, and 406d (bottom interface electrodes 406) of programmed interposer 474. More particularly, top solder bumps 426a, 426b, 426c, 426d, and 426e are electrically connecting semiconductor die 454 to programmed paths 424a, 424b, and 424c of programmed interposer 474. Furthermore, PCB 452 is situated under programmed interposer 474 and is electrically connected to semiconductor die 454 thorough programmed interposer 474. Thus, programmed interposer 474 can facilitate connection between semiconductor die 454 and other electrical components. Thus, in this exemplary implementation, the disclosed programmable interposer can be utilized to provide various programmed paths to accommodate electrical connectivity between semiconductor die 454 and PCB 452, without requiring highly differentiated design and fabrication processes. Among other advantages, this implementation of the present disclosure can thereby enable use of an interposer in applications where such use would otherwise be cost and/or time prohibitive.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A programmable interposer comprising:
    top and bottom interface electrodes having one or more top interface electrodes offset from one or more bottom interface electrodes along an axis that is parallel to the top and bottom interface electrodes, wherein one or more of the top interface electrodes are non-overlapping with one or more of the bottom interface electrodes; and
    conductive particles electrically connecting the top and bottom interface electrodes in one or more programmed states of the programmable interposer, the one or more programmed states including a programmed state that electrically connects the conductive particles from a bottom interface electrode to a non-overlapping top interface electrode, the conductive particles configured to form different aligned configurations between said top and bottom interface electrodes in response to application of different energy fields to said programmable interposer.

2. The programmable interposer of claim 1, wherein said conductive particles are within a bulk material of an interface layer in said programmable interposer.

3. The programmable interposer of claim 1, wherein said conductive particles are selected from the group consisting of carbon nanotubes (CNT) and nano wires.

4. The programmable interposer of claim 2, wherein said bulk material comprises a dielectric film.

5. The programmable interposer of claim 2, wherein said bulk material is capable of being cured.

6. The programmable interposer of claim 1, wherein said conductive particles have conductive outer surfaces.

7. The programmable interposer of claim 1, wherein said conductive particles are spherical.

8. A semiconductor package comprising:
    a programmed interposer including top interface electrodes having respective first surfaces and bottom interface electrodes having respective second surfaces, wherein one or more of the top interface electrodes are non-overlapping with one or more of the bottom interface electrodes along an axis that is parallel to the first and second surfaces;
    said programmed interposer including conductive particles electrically connecting the top and bottom interface electrodes through one or more programmed paths of the semiconductor package, said one or more programmed paths including a programmed path that electrically connects the conductive particles from a top interface electrode to a non-overlapping bottom interface electrode, the conductive particles configured to form different programmed paths based on different energy fields applied to the semiconductor package; and
    a semiconductor die electrically connected to said top interface electrode and said bottom interface electrode of said programmed interposer.

9. The semiconductor package of claim 8, wherein a printed circuit board (PCB) is situated under said programmed interposer.

10. The programmed interposer of claim 8, wherein said programmed interposer includes a top substrate and a bottom substrate.

11. The programmed interposer of claim 8, comprising at least one solder bump electrically connecting said semiconductor die to said programmed path of said programmed interposer.

12. The semiconductor package of claim 8, wherein said programmed path is formed from said conductive particles in response to application of an energy field.

13. The semiconductor package of claim 8, wherein said conductive particles are within a bulk material of an interface layer in said programmed interposer.

14. The semiconductor package of claim 8, wherein said conductive particles are selected from the group consisting of carbon nanotubes (CNT) and nano wires.

15. A method for fabricating a programmed interposer comprising:
    applying an energy field to a programmable interposer to move conductive particles situated within said programmable interposer for forming a first aligned configuration between top and bottom interface electrodes of said programmable interposer;
    varying the energy field applied to the programmable interposer to move the conductive particles to form a second aligned configuration between the top and bottom interface electrodes that differs from the first aligned configuration; and
    securing said conductive particles of said second aligned configuration into a programmed path.

16. The method of claim 15, wherein said securing comprises curing said programmable interposer.

17. The method of claim 15 further comprising situating said top and said bottom interface electrodes on respective top and bottom sides of said programmable interposer prior to said applying said energy field.

18. The method of claim 15, wherein said energy field comprises a magnetic field.

19. The method of claim 15, wherein said energy field comprises an electric field.

20. The method of claim 15, further comprising providing at least one substrate for said programmable interposer.

21. The method of claim 15, wherein:
    the first aligned configuration is between at least a first top interface electrode and a first bottom interface electrode, and the second aligned configuration is between at least the first top interface electrode and a second bottom interface electrode that is different from the first bottom interface electrode.

* * * * *